(12) United States Patent
Richter et al.

(10) Patent No.: US 9,614,003 B1
(45) Date of Patent: Apr. 4, 2017

(54) METHOD OF FORMING A MEMORY DEVICE STRUCTURE AND MEMORY DEVICE STRUCTURE

(71) Applicant: GLOBALFOUNDRIES Inc., Grand Cayman (KY)

(72) Inventors: Ralf Richter, Radebeul (DE); Yu-Teh Chiang, Dresden (DE); Ran Yan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/918,736

(22) Filed: Oct. 21, 2015

(51) Int. Cl.
| | | |
|---|---|---|
| *H01L 43/02* | (2006.01) | |
| *H01L 43/08* | (2006.01) | |
| *H01L 43/12* | (2006.01) | |
| *H01L 27/22* | (2006.01) | |

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC ............................. H01L 27/228; H01L 43/02
USPC .............................................................. 438/3
See application file for complete search history.

(56) References Cited

U.S. PATENT DOCUMENTS

| | | | | |
|---|---|---|---|---|
| 9,263,665 B1* | 2/2016 | Tran | ........................ | H01L 43/08 257/108 |
| 9,299,924 B1* | 3/2016 | Annunziata | ............. | H01L 43/12 438/3 |
| 9,343,662 B2* | 5/2016 | Tan | ........................ | H01L 43/12 257/422 |
| 2002/0132375 A1* | 9/2002 | Doan | ..................... | B82Y 10/00 438/3 |
| 2005/0052938 A1* | 3/2005 | Horikoshi | .............. | B82Y 10/00 365/232 |
| 2005/0068806 A1* | 3/2005 | Hurst | ...................... | G11C 11/15 365/173 |
| 2014/0203341 A1* | 7/2014 | Guo | ..................... | H01L 27/1159 257/295 |
| 2014/0273285 A1* | 9/2014 | DeBrosse | ............. | H01L 27/228 438/3 |

* cited by examiner

*Primary Examiner* — Moazzam Hossain
(74) *Attorney, Agent, or Firm* — Amerson Law Firm, PLLC

(57) ABSTRACT

The present disclosure provides a memory device structure including a wafer substrate, a magnetic tunnel junction (MTJ) formed by a first magnetic layer, a second magnetic layer, and a thin non-magnetic layer stacked along a first direction perpendicular to an upper surface of the wafer substrate above which the MTJ is formed, the non-magnetic layer being interposed between the first magnetic layer and the second magnetic layer, a first contact electrically coupled to the first magnetic layer, and a second contact electrically coupled to the second magnetic layer.

18 Claims, 5 Drawing Sheets

METHOD OF FORMING A MEMORY DEVICE STRUCTURE AND MEMORY DEVICE STRUCTURE

BACKGROUND

1. Field of the Disclosure

In general, the present disclosure relates to a method of forming a memory device structure and to a memory device structure, and, more particularly, to the formation of memory device structures including magnetic random access memory techniques at advanced technology scales, such as 40 nm and beyond.

2. Description of the Related Art

At present, semiconductor and magnetic storage technologies represent some of the most commonly used data storage technologies. Semiconductor memory uses semiconductor-based circuit elements, such as transistors or capacitors, to store information, and common semiconductor memory chips may contain millions of such circuit elements. Both volatile and non-volatile forms of semiconductor memory exist. In modern computers, primary storage almost exclusively consists of dynamic volatile semiconductor memory or dynamic random access memory (DRAM). Since the turn of the century, a type of non-volatile semiconductor memory known as flash memory has steadily gained share as off-line storage for home computers. Non-volatile semiconductor memory is also used for secondary storage in various advanced electronic devices and specialized computers.

In magnetic memory, information is stored by using different patterns of magnetization in magnetic layers, films or surfaces. As opposed to DRAM, magnetic storage is non-volatile and earlier implementations of magnetic storage made use of one or more read/write heads which may contain one or more recording transducers for accessing information stored in magnetically coated surfaces, where the read/write head only covered a part of the surface so that the head or medium or both move relative to another in order to access data.

A concept that may be considered as uniting DRAM and magnetic memory techniques is the so-called magnetoresistive random-access memory (MRAM). A memory cell of an MRAM type is similar in design to a memory cell of a DRAM type, but differs in that MRAMs employ magnetic storage elements for storing information instead of storing information as electric charge on a capacitor as is the case in DRAM cells. Therefore, unlike DRAMs losing their charge over time, MRAMs represent non-volatile memory devices that do not have to refresh memory cells of memory chips by reading each single memory cell and rewriting the content of each single memory cell as is the case in DRAM technologies.

This has an important impact on future developments. For example, when considering memory devices of the next generation, that is, at technology nodes of 40 nm and beyond, e.g., at 28 nm and beyond, a scaling of DRAM cells requires a more frequent refreshing of the individual memory cells, resulting in greater power consumption of DRAM memory structures. In contrast, an MRAM cell never requires a refresh, but retains its memory even when the power is turned off as there is no constant power draw necessary for storing data in MRAM memory devices.

It is also worth comparing MRAM with another common memory system, flash RAM. Like MRAM, flash does not lose its memory when power is removed, which makes it very common as a "hard disc replacement" in small devices, such as digital audio players or digital cameras. With regard to reading, flash and MRAM have very similar power requirements, whereas, for writing/rewriting, flash is rewritten using a large pulse of voltage (about 10V) that is stored up over time in a charge pump, which is both power hungry and time consuming. In addition, the current pulse physically degrades the flash cells, which means that a flash memory can only be written to some finite number of times before it must be replaced. In contrast, MRAM requires only slightly more power to write than read, and no change in the voltage, eliminating the need for a charge pump. This leads to a much faster operation, lower power consumption and indefinitely long "live time" for MRAM in comparison with flash memory.

Generally, MRAMs need less "settling time" because MRAM operation is based on measuring voltages rather than charges or currents as in DRAM operation. Even in comparison to flash memory, significant differences appear such that write times of MRAM devices are even thousands of times faster than write times of flash memory devices. In this regard, the only memory technology that presently may compete with MRAM in terms of performance may be static RAM (SRAM). However, an SRAM memory cell consists of a series of transistors arranged in a flip-flop, typically four or six transistors, such that the integration density is lower when compared to DRAM, flash memory and MRAM.

Therefore, although MRAM is not quite as fast as SRAM, it may allow for higher integration densities and is therefore even interesting in applications that employ SRAM technology, that is, applications with very low power requirements.

Overall, MRAM has similar performance to SRAM, similar density to DRAM, but much lower power consumption than DRAM, and is much faster and suffers no degradation over time in comparison to flash memory. It is this combination of features that makes MRAM attractive as the "universal memory" able to replace SRAM, DRAM and flash.

Turning to the basic design of a conventional MRAM memory cell, a so-called "magnetic tunnel junction" (MTJ) is used to form the memory cell structure, which is controlled by a transistor as in DRAM cell structures. Generally, the MTJ is formed from two ferromagnetic plates, each of which can hold a magnetization, separated by a thin insulating layer acting as a tunnel barrier. In an MTJ, one of the two plates is configured as a permanent magnetic set to a particular polarity, commonly referred to as "the magnetic pinned layer," while the other plate is configured such that its magnetization can be changed to a magnetization direction parallel or anti-parallel relative to the magnetization of the magnetic pinned layer, this other layer being commonly referred to as the "magnetic free layer." This configuration is also known as a spin valve and represents the simplest structure for an MRAM bit. An MRAM memory device may be built from a grid of such "cells."

In MRAM cells as described above, a reading operation may be accomplished by measuring the electrical resistance over a cell, wherein a particular cell is typically selected by powering the associated transistor, switching current from a supply line through the cell to ground. The effect one makes use of is as follows: due to the magnetic tunnel effect, the electrical resistance of the cell changes based on the orientation of the fields in the magnetic pinned layer and the magnetic free layer. By measuring the resulting current, the resistance inside any particular cell can be determined, and from this the magnetization polarity of the writable plate. Typically, if the two magnetic plates have the same polarity, this may be considered to mean "1", while if the two plates are of opposite polarity, the resistance will be higher indicating "0".

A writing process for writing data to an MRAM cell may be performed in different ways. In one writing technique (classic technique'), each cell lies between a pair of write lines arranged at right angles to each other, parallel to the cell, one above and one below the cell. When current is passed through the write lines, an induced magnetic field is created at the junction and is picked up by the magnetic free layer. This technique suffers from several drawbacks because it requires a fairly substantial current to generate the field and makes it less interesting for low power uses. Furthermore, upon scaling down the cell in size, the risk of the induced field overlapping adjacent cells over a small area increases and, therefore, the risk of false writes increases. Accordingly, a fairly large minimum size is necessary for this type of cell.

In accordance with another technique, spin transfer torque (STT) or spin transfer switching is employed by using spin aligned ("polarized") electrons to directly torque the domains. Specifically, if the electrons flowing into a magnetic layer have to change their spin, this will develop a torque that will be transferred to the nearby layer. Accordingly, the amount of current needed to write the cells may be lowered, making it about the same as the read process.

There are concerns that the 'classic' type of MRAM cell will have difficulty at high densities due to the amount of current needed during writing, a problem that STT avoids. For this reason, the STT proponents expect the technique to be used for devices of 65 nm and smaller. The downside is the need to maintain spin coherence. Overall, the STT requires a comparatively low write current when compared to the classic write technique. For STT-MRAMs, scalability is not an issue because the current required in STT switching can be reduced with the device size.

In general, the design of an STT-MRAM cell at high integration density is required to fulfill the following requirements. For the first requirement, it is important to have a large signal so that the two states (low resistance and high resistance) could be well separated. The second requirement for a functional STT-MRAM is that it have a low resistance or, more specifically, the product of the resistance and the junction area (RA) be low (where the parameter A is the area of the device). It is relatively easy to achieve a high difference between low resistance and high resistance by increasing the tunnel barrier thickness, but the junction area (RA) will increase almost exponentially. The value of the junction area (RA) is actually dictated by the value of the breakdown voltage of the tunnel barrier which is the critical voltage that can be applied to the MTJ before it becomes damaged. Accordingly, the switching of the magnetic free layer should occur before reaching the breakdown voltage. The third criteria relates to thermal stability demanding that information stored in an MRAM is stable for a period of ten years. The fourth key parameter in STT-MRAM techniques is to limit the switching current according to the size of the transistor used because smaller switching current helps to achieve large storage capacity for the STT-MRAM with scaled transistors. Finally, it is highly desirable to achieve the above requirements for STT-MRAM techniques with a suitable fabrication process that does not compromise CMOS integration.

Furthermore, with regard to the magnetic pinned layer and the magnetic free layer, two basic concepts exist. According to the first concept, the magnetic layers can have an in-plane magnetization wherein the magnetic layers have a magnetization perpendicular to a thickness direction of the magnetic layers. Alternatively, according to the second concept, the magnetic layers have a magnetization parallel to the thickness direction of the magnetic layers. While MRAM technology using the first concept is mature and in production for 90 nm, MRAM cells using the second concept, i.e., magnetic layers with parallel magnetization, are still in the research phase. It should be noted that the magnetic material engineering is very different for the two concepts. With regard to the first concept, i.e., magnetic layers with in-plane (perpendicular) magnetization, this concept is not scalable below 40 nm because the thermal stability of the magnetization (the temperature induced switching of the magnetization) scales with the MRAM element size and reaches its lowest limit at about 40 nm. Furthermore, thermal stability of MRAM made according to the second concept (with parallel magnetization) scales with the shape anisotropy of the MRAM cell geometry (which is of elliptical shape for in-plane magnetic layers), resulting in additional area needed for MRAM elements. At present, MRAMs made according to the second concept according to which the magnetization is parallel to the thickness direction of the magnetic layers, appear to be the better option for technologies of 20 nm and below as the intrinsic energy barrier (magnetic anisotropy) for switching the magnetization is larger and does not depend on the MRAM cell geometry. However, the materials with perpendicular magnetic anisotropy as used in the second concept are more expensive and critical to handle during the fabrication processes.

In view of the above discussion, it is desirable to provide a functional MRAM concept with in-plane magnetization at smaller scales, particularly at scales smaller than 40 nm.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect, the present disclosure provides a method of forming a memory device structure. In accordance with some illustrative embodiments herein, the method includes providing a dielectric layer formed over a wafer substrate, forming at least two trenches in the dielectric layer, the at least two trenches completely passing through the dielectric layer along a first direction which is substantially perpendicular to an upper surface of the wafer substrate, forming a thin non-magnetic layer on sidewalls of the at least two trenches, forming a first magnetic layer on the thin non-magnetic layer over the sidewalls, selectively removing the dielectric layer relative to the thin non-magnetic layer and the first magnetic layer, wherein at least four first vertical stacks are formed upon removing the dielectric layer, each stack being formed from the thin non-magnetic layer and the first magnetic layer which are stacked along a second direction perpendicular to the first direction, forming a second magnetic layer on sidewalls of the first vertical stacks, wherein second vertical stacks are formed, each second vertical stack having the thin non-magnetic layer interposed between the first magnetic layer and the second magnetic layer, and embedding the second vertical stacks into metal material, wherein a first electrical contact in contact with the first magnetic layer and a second electrical contact in contact with the second magnetic layer is formed.

In a second aspect of the present disclosure, a memory device structure is provided. In accordance with some illustrative embodiments herein, the memory device structure includes a wafer substrate, a magnetic tunnel junction (MTJ) comprising a first magnetic layer, a second magnetic layer, and a thin non-magnetic layer stacked along a first direction perpendicular to an upper surface of the wafer substrate above which the MTJ is formed, the non-magnetic layer being interposed between the first magnetic layer and the second magnetic layer, a first contact electrically coupled to the first magnetic layer, and a second contact electrically coupled to the second magnetic layer.

BRIEF DESCRIPTION OF THE DRAWINGS

The disclosure may be understood by reference to the following description taken in conjunction with the accompanying drawings, in which like reference numerals identify like elements, and in which.

Figure 1A:
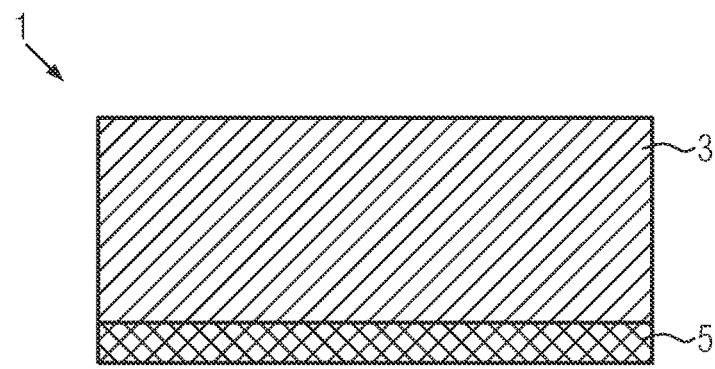
FIGS. 1a-1k schematically illustrate a process flow of forming a memory device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure may employ forming a semiconductor device on and in a chip. In accordance with some illustrative embodiments of the present disclosure, the semiconductor device may substantially represent a FET, e.g., a MOSFET or MOS device. When referring to a MOS device, the person skilled in the art will appreciate that, although the expression "MOS device" is used, no limitation to a metal-containing gate material and/or to an oxide-containing gate dielectric material is intended. Furthermore, the semiconductor devices as disclosed herein may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Memory device structures of the present disclosure concern devices which may be fabricated by using advanced technologies, i.e., technologies applied to approach technology nodes smaller than 100 nm, for example, smaller than 50 nm or smaller than 35 nm, e.g., at 28 nm or below. After a complete reading of the present application, a person skilled in the art will appreciate that, according to the present disclosure, ground rules smaller or equal to 45 nm, e.g., at 28 nm or below, may be imposed. In one illustrative embodiment, the present disclosure proposes semiconductor devices that may have structures of minimal length dimensions and/or width dimensions smaller than 100 nm, for example, smaller than 50 nm or smaller than 35 nm or smaller than 28 nm. For example, the present disclosure may disclose device structures fabricated by using 45 nm technologies or below, e.g., 28 nm or even below.

After a complete review of the present disclosure, the person skilled in the art will appreciate that a memory device structure, as described below with regard to some illustrative embodiments of the present disclosure, comprises a memory device, such as an MTJ structure, together with a semiconductor device, such as a PMOS device or an NMOS device.

In some illustrative embodiments of the first aspect of the present disclosure, the method may include providing a dielectric layer formed over a wafer substrate, forming at least two trenches in the dielectric layer, the at least two trenches completely passing through the dielectric layer along a first direction which is substantially perpendicular to an upper surface of the wafer substrate, forming a thin non-magnetic layer on sidewalls of the at least two trenches, forming a first magnetic layer on the thin non-magnetic layer over the sidewalls, selectively removing the dielectric layer relative to the thin non-magnetic layer and the first magnetic layer, wherein at least four first vertical stacks are formed upon removing the dielectric layer, each stack being formed from the thin non-magnetic layer and the first magnetic layer which are stacked along a second direction perpendicular to the first direction, forming a second magnetic layer on sidewalls of the first vertical stacks, wherein second vertical stacks are formed, each second vertical stack having the thin non-magnetic layer interposed between the first magnetic layer and the second magnetic layer, embedding the second vertical stacks into metal material, wherein a first electrical contact in contact with the first magnetic layer and a second electrical contact in contact with the second magnetic layer are formed, providing a MOSFET device having a gate electrode coupled to a word line, a source electrode and a drain electrode, forming the dielectric layer over the MOSFET device, and providing a memory cell comprising the MOSFET device and one of the second vertical stacks, wherein the memory cell is formed by electrically coupling one of the first and second contacts to one of the source and drain electrode, and electrically coupling the other one of the first and second contacts to a bit line. In accordance with some special illustrative examples herein, the MOSFET device may be an NMOS device and the second contact may be electrically coupled to the drain electrode of the NMOS device, while the second contact may be electrically coupled to the bit line.

In accordance with some illustrative embodiments of the second aspect, the memory device structure may include a wafer substrate, an MTJ comprising a first magnetic layer, a second magnetic layer and a thin non-magnetic layer stacked along a first direction perpendicular to an upper surface of the wafer substrate above which the MTJ is formed, the non-magnetic layer being interposed between the first magnetic layer and the second magnetic layer, a first contact electrically coupled to the first magnetic layer, a second contact electrically coupled to the second magnetic layer, a MOSFET device having a gate electrode coupled to a word line, a source electrode and a drain electrode, the MOSFET device being formed over the wafer substrate, a first electrically conductive line coupling one of the first and second contacts to one of the source and drain electrodes, and a second electrically conductive line coupling the other one of the first and second contacts to a bit line. In accordance with some special examples herein, the MOSFET device may be an NMOS device and the first electrically conductive line may couple the second contact to the drain electrode of the NMOS device, while the second electrically conductive line may couple the second contact to the bit line.

In accordance with some illustrative examples of the first and second aspects, the first and second magnetic layers may be formed from ferromagnetic materials having different magnetic coercivities. Alternatively, the second magnetic layer may be coupled with an antiferromagnetic material inducing an exchange bias in the second magnetic layer. The person skilled in the art will appreciate that the exchange bias occurs in bilayers (or multilayers) of magnetic materials where the hard magnetization behavior of an antiferromagnetic thin film causes a shift in the soft magnetization curve of a ferromagnetic film.

In accordance with some illustrative examples of the first and second aspects, a thickness of the first magnetic layer may be smaller than a thickness of the second magnetic layer.

In accordance with some illustrative examples of the first and second aspects, the first magnetic layer may have a magnetic coercivity that is greater than that of the second magnetic layer.

In accordance with some illustrative examples of the first and second aspects, a thickness of the thin non-magnetic layer may be in a range from about 2-50 Å (or about 0.2-5 nm).

In accordance with some illustrative embodiments of the first and second aspects, the thin non-magnetic layer may be formed of magnesium oxide. This does not impose any limitation to the present disclosure and other materials may be employed, e.g., aluminum oxide and the like.

In the following, some illustrative embodiments of the present disclosure are described with regard to FIGS. 1a-1k. FIG. 1a schematically illustrates a portion 1 of a semiconductor device structure at an early stage during fabrication of an illustrative memory device structure.

In accordance with some illustrative embodiments of the present disclosure, the depicted portion 1 may comprise an interlayer dielectric (ILD) layer 3 as formed during back end of line (BEOL) processing after at least one semiconductor device (not illustrated) is formed on a wafer substrate (not illustrated), e.g., a bulk substrate or an SOI substrate. In accordance with some illustrative examples, the ILD layer 3 may comprise a low-k dielectric material (i.e., a material with a small dielectric constant or k value relative to silicon dioxide, thus k<3.5) and may be formed on a thin layer 5 of insulating material, such as a barrier low-k (so-called BLoK) material, or any other appropriate insulating material known in the art, such as silicon nitride or silicon oxide. This does not impose any limitation to the present disclosure and the person skilled in the art will appreciate that, instead of the ILD layer 3, an active semiconductor layer of an SOI substrate may be considered where layer 5 represents a buried oxide (BOX) material layer. Accordingly, no limitation of the present disclosure is intended, although the following description makes use of the ILD layer 3 and the thin layer 5 of insulating material.

Figure 1B:
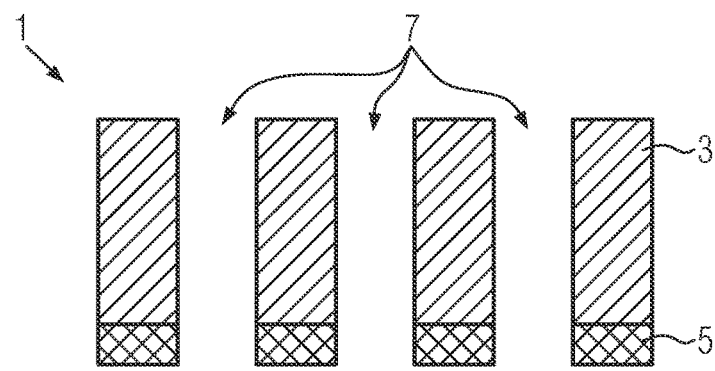

FIG. 1b schematically illustrates the portion 1 at a more advanced stage during fabrication after a patterning process is performed to pattern the ILD layer 3 and the thin layer 5, wherein trenches 7 passing through the ILD layer 3 and the thin layer 5 are formed. In accordance with some illustrative embodiments of the present disclosure, the trenches 7 may be formed by known patterning processes, such as depositing a resist material (not illustrated), patterning the resist material (not illustrated) via known lithographical methods, performing an anisotropic etch process, e.g., reactive ion etch (RIE) process, to etch trenches through the ILD layer 3 and the thin layer 5, and removing the resist material (not illustrated).

Figure 1C:
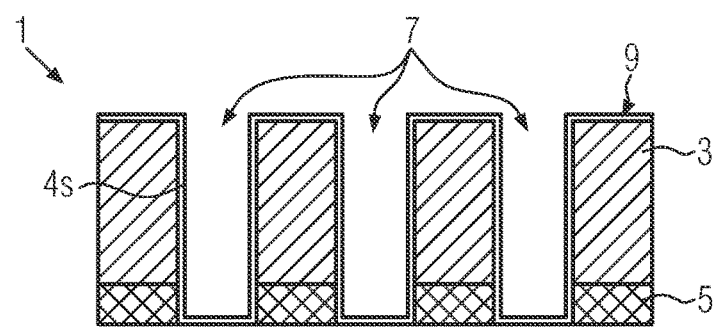

FIG. 1c schematically illustrates the portion 1 at a more advanced stage during fabrication after a layer of insulating material 9 is deposited over the patterned ILD layer 3 and the patterned thin layer 5 by performing a conformal deposition process, e.g., ALD. In accordance with some illustrative embodiments of the present disclosure, the deposited insulating material 9 may be one of magnesium oxide and aluminum oxide and the like. For example, the layer of insulating material 9 may have a thickness in a range from about 2-50 Å.

Figure 1D:
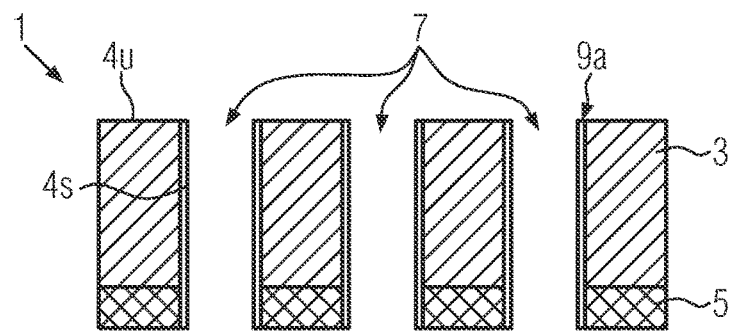

FIG. 1d schematically illustrates the portion 1 at a more advanced stage during fabrication after an anisotropic etching process was performed for removing the horizontally oriented portions of the insulating material layer 9 (FIG. 1c) from an upper surface of the ILD layer 3, wherein upper surfaces 4u of the ILD layer 3 are exposed, and the bottom of the trenches 7, thereby leaving sidewalls 4s of the trenches 7 covered with the insulating material layer 9. Accordingly, at this stage, as illustrated in FIG. 1d, the remaining portions of the insulating layer (in the following denoted by 9a) remain positioned in the trenches 7 covering the sidewalls 4s of the trenches 7.

Figure 1E:
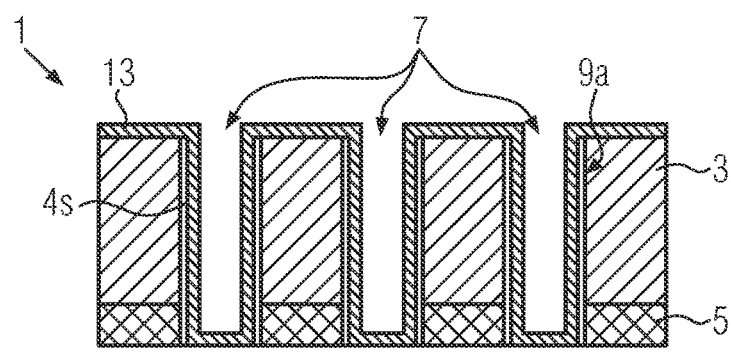

FIG. 1e schematically illustrates the portion 1 at a more advanced stage during fabrication after a first magnetic material 13 is deposited over the ILD layer 3 and in the trenches 7 by performing a conformal deposition process. In accordance with some illustrative examples herein, the first magnetic material 13 may be one of a CoFe alloy and a CoFeB alloy, possibly including a rare earth species and/or a transition metal species, such as TbFeCo, GdFeCo, etc. In accordance with some illustrative examples, a thickness of the deposited first magnetic material 13 may be in a range from about 10 Å and more, such as at 15 Å or more, for example at about 20 Å and more.

Figure 1F:
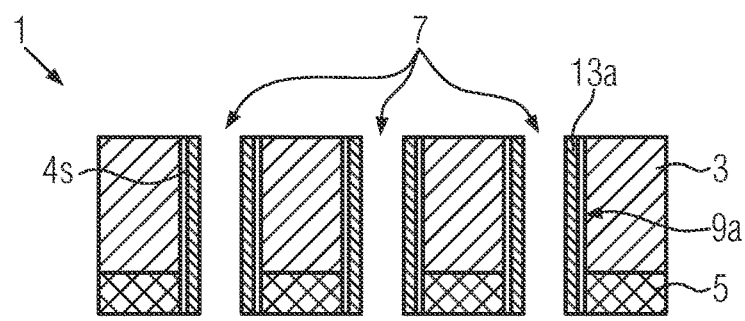

FIG. 1f schematically illustrates the portion 1 at a more advanced stage during fabrication after an anisotropic etch process is completed, the anisotropic etch process removing the horizontally oriented portions of the first magnetic material 13 from the upper surface 4u of the ILD layer 3 and from the bottom of the trenches 7. As a result, the upper surface 4u of the ILD layer 3 is exposed and the remaining portions of the first magnetic layer (in the following denoted by 13a) is formed on the insulating material layer 9a within the trenches 7.

Figure 1G:
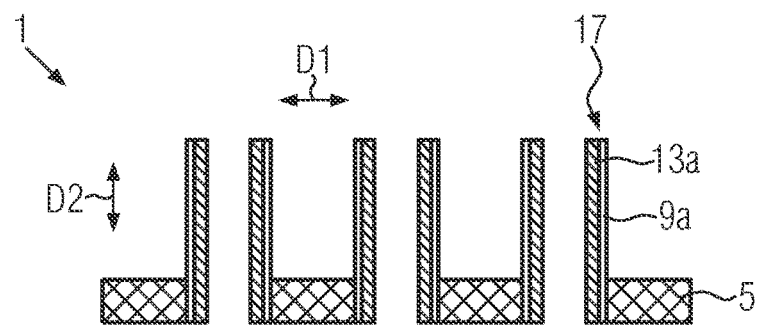

FIG. 1g schematically illustrates the portion 1 at a more advanced stage during fabrication after a selective etching process was completed, and the selective etching process selectively removed the ILD layer 3 relative to the insulating material layer 9a, the first magnetic layer 13a and the thin layer 5. Accordingly, substantially vertical stacks, such as a first vertical stack 17, may be left at the stage illustrated in FIG. 1g, the first vertical stack 17 being formed from the first magnetic layer 13a and the insulating material layer 9a stacked along a direction D1 parallel to a thickness of the first magnetic layer 13a and the insulating material layer 9a. That is, the vertical stack 17 is oriented along a direction D2 perpendicular to the direction D1.

Figure 1H:
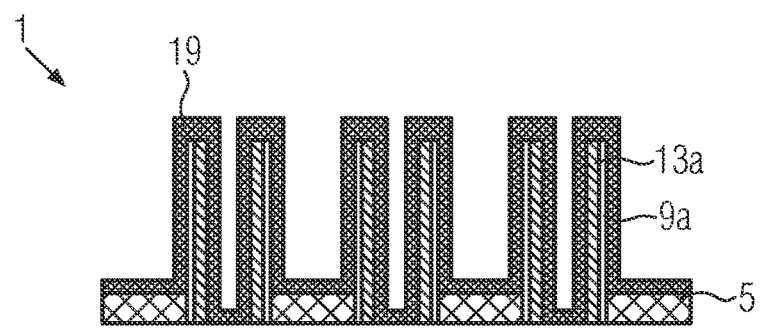

FIG. 1h schematically illustrates the portion 1 at a more advanced stage during fabrication after a second magnetic material 19 is deposited over the first vertical stacks 17 by performing a conformal deposition process, e.g., ALD. The second magnetic material 19 may substantially differ from the first magnetic material (13 in FIG. 1e) in that at least one of a magnetic coercivity, rest magnetization and saturation magnetization of the second magnetic material 19 may be substantially smaller when compared to the first magnetic material. In accordance with some illustrative embodiments of the present disclosure, the first magnetic material may be a hard-magnetic material and the second magnetic material may be a soft magnetic material, particularly when compared to the first magnetic material. Alternatively or additionally, a thickness of the deposited second magnetic material 19 may be substantially greater than a thickness of the first magnetic layer 15.

Figure 1I:
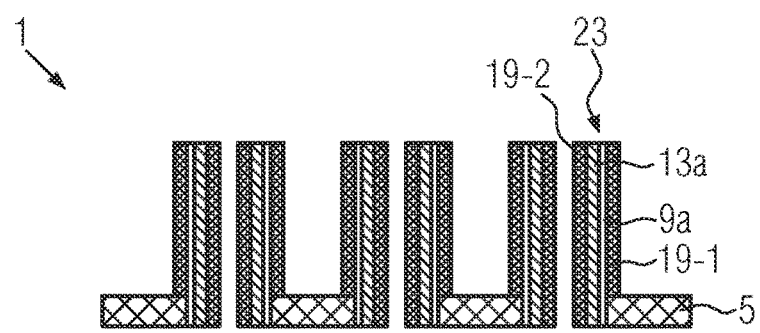

FIG. 1i schematically illustrates the portion 1 at a more advanced stage during fabrication after an anisotropic etch process was performed and the horizontally oriented portions of the deposited second magnetic material 19 was removed from upper surfaces of the first vertical stacks and from the bottom of the trenches 7. This results in the formation of second substantially vertical stacks 23 comprising a stack formed by the first magnetic layer 13a, the insulating material layer 9a and a second magnetic layer portion 19-1, wherein the insulating material layer 9a is interposed therebetween.

As depicted in FIG. 1i, a further second magnetic layer portion 19-2 may be formed as part of the second vertical stacks 23 such that the second magnetic layer portion 19-2 may be directly positioned on the first magnetic layer 13a. After a complete reading of the present application, the person skilled in the art will appreciate that the second vertical stacks 23 comprising the first magnetic layer 13a, the second magnetic layer portion 19-2, the first magnetic layer portion 19-1 and the insulating material layer 11 may be provided, wherein the insulating material layer 9a is interposed between the first magnetic layer 13a and the first magnetic layer portion 19-1.

Figure 1J:
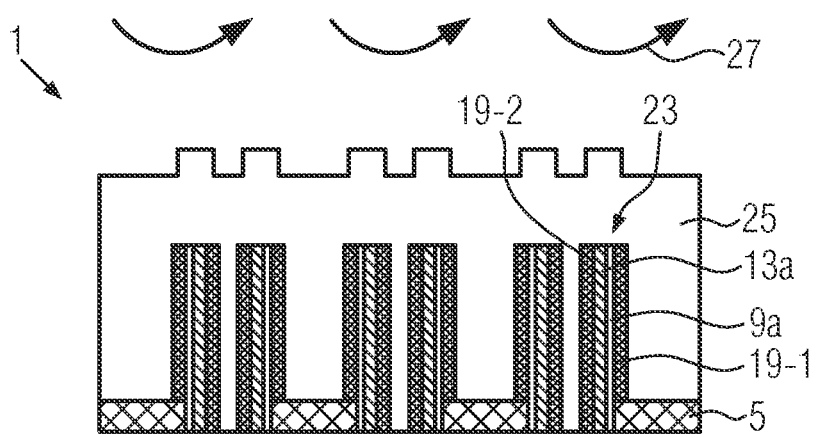

FIG. 1j schematically illustrates the portion 1 at a more advanced stage during fabrication, after an electrode material filling process (not illustrated) is performed, wherein electrode material 25 may be deposited, the electrode material 25 filling trenches provided between the second vertical stacks 23, wherein space between the second vertical stacks 23 was overfilled by the electrode material 25. The electrode material 25 may be made from any type of conductive material or a combinations of conductive materials. In one illustrative embodiment, the electrode material may be Pt, Al, Cu or the like.

Figure 1K:
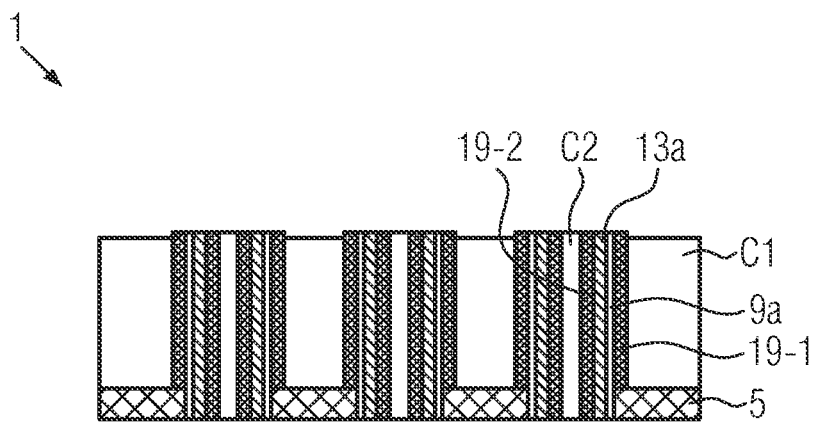

FIG. 1k schematically illustrates the portion 1 at a more advanced stage during fabrication after a polishing process 27 (see FIG. 1j), such as a chemical mechanical polishing (CMP) process, was performed and upper surfaces of the second vertical stacks are exposed.

In accordance with some illustrative embodiments of the present disclosure, a contact C2 for providing electrical contact to the first magnetic layer 13a (via the second magnetic layer portion 19-2) and a contact C1 contacting the first magnetic layer portion 19-1 may be formed.

Referring to FIG. 1k, a memory cell structure comprising the second vertical stacks 23 formed of the first magnetic layer 13a, the second magnetic layer portion 19-2, the first magnetic layer portion 19-1 (wherein the insulating material layer 9a is interposed between the first magnetic layer 13a and the first magnetic layer portion 19-1) having contacts C2, C1 providing electrical connection to respective ones of the first magnetic layer 13a and the first magnetic layer portion 19-1. In accordance with some illustrative examples herein, the first magnetic layer portion 19-1 may represent a magnetic pinned layer having a fixed magnetization, while the first magnetic layer 13a may correspond to a magnetic free layer having soft magnetic properties, that is a layer being made from a soft-magnetic material.

Figure 2:
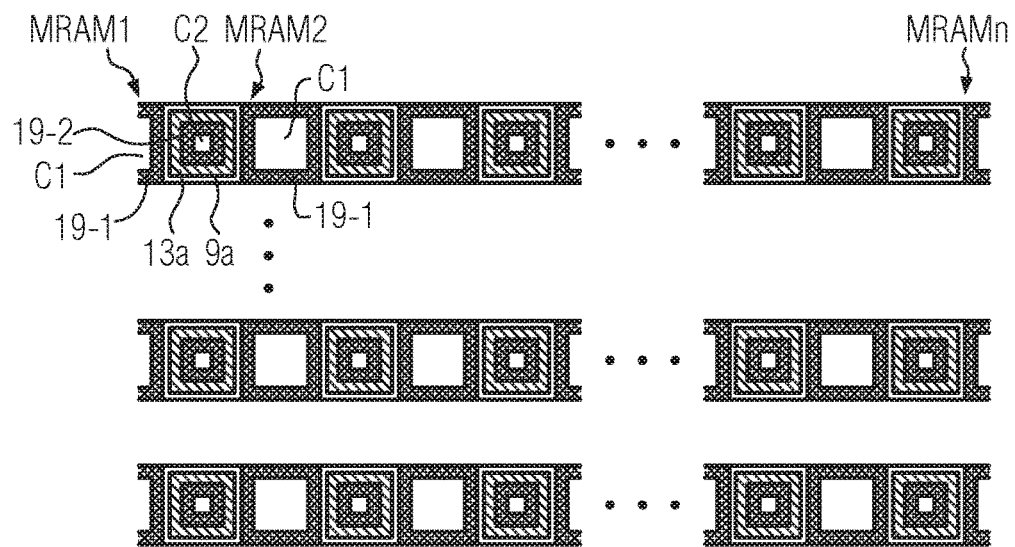
FIG. 2 schematically illustrates a top view of a plurality of memory cells in accordance with some illustrative embodiments of the present disclosure.

With regard to FIG. 2, a top view of one illustrative embodiment of an MRAM device structure is schematically illustrated, wherein single memory cells MRAM1, MRAM2 . . . MRAMn are provided. Each MRAM cell may comprise a first contact (contact C1 in FIG. 2 of MRAM1), a second contact (C2 in FIG. 2 of MRAM1), a first magnetic layer (13a in FIG. 2 of MRAM1), a first magnetic layer portion (19-1 in FIG. 2 of MRAM1), and the insulating barrier layer (9a in FIG. 2 of MRAM1). After a complete reading of the present application, a person skilled in the art will appreciate that, along a direction perpendicular to the illustrated sectional plane (i.e., into and out of the plane of the drawing page), a MOSFET device (not illustrated in FIG. 2) may be disposed below each of the memory cells MRAM1 to MRAMn, the MOSFET device (not illustrated in FIG. 2) controlling the respective memory cells.

Figure 3:
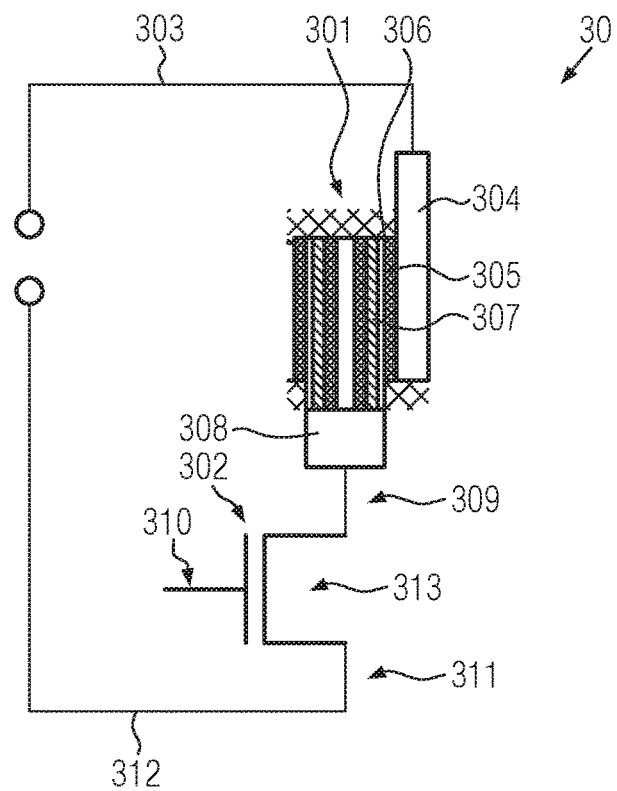
FIG. 3 schematically illustrates a memory device in accordance with some illustrative embodiments of the present disclosure.

Next, the operation of a memory device structure in accordance with some illustrative embodiments of the present disclosure will be described. FIG. 3 schematically illustrates, in a cross-sectional view, a memory device structure 30 comprising a memory cell 301 (or MTJ device) and an illustrative MOSFET device 302 controlling the memory cell 301.

After a complete reading of the present application, a person skilled in the art will appreciate that the MOSFET device 302 may be, for example, formed in accordance with front end of line (FEOL) processing as known in the art and may be disposed below the memory cell 301, that is, the memory cell 301 may be formed in a desired metallization layer as formed over or above the MOSFET 302 in BEOL processing as it is known in the art.

In accordance with some illustrative embodiments of the present disclosure, the memory cell 301 may comprise a bit line 303 which is electrically coupled to a first contact 304 (e.g., C1) contacting a first magnetic layer 305 (e.g., first magnetic layer portion 19-1 of FIG. 2) of an MTJ structure having a second magnetic layer 307 (e.g., first magnetic layer 13a of FIG. 2) separated from the first magnetic layer 305 by a dielectric layer 306 (e.g., insulating material layer 9a of FIG. 2) interposed between the first and second magnetic layers 305 and 307. Electrical connection to the second magnetic layer 307 may be provided by a second contact 308 (e.g., C2) which may also be electrically coupled to a drain contact 309 of the MOSFET device 302. The MOSFET device has a gate electrode 313 electrically coupled to a word line 310, and a source contact 311 which may be electrically coupled to a source line 312. In the depicted example, the second contact 308 (e.g., C2) physically contacts the second magnetic layer portion 19-2 (see, FIG. 2) that is positioned on the second magnetic layer 307 (e.g., the first magnetic layer 13a of FIG. 2). A correspondence to the embodiments as described with FIG. 2 and indicated in parentheses is only illustrative and does not pose any limitation to the present disclosure as will be described below.

In order to read out a bit state, e.g. "1" or "0", a magnetoresistance of an MTJ device of some illustrative embodiments of the present disclosure is measured (the word line 310 coupled to the MOSFET device 302 is controlled such that the MOSFET device 302 is in a connecting state, i.e, when current is flowing through the MOSFET device 302). After a complete reading of the present application, a person of ordinary skill in the art will appreciate that the MTJ device disclosed herein may be operated and configured such that either one of the first and second magnetic layers 305, 307 may function as the "magnetic pinned" layer (having hard magnetic characteristics) of the MTJ device while the other of the first and second magnetic layers 305, 307 may function as the "magnetic free" layer (having soft magnetic properties) of the MTJ device. When the magnetization of the magnetic free layer (one of the first and second magnetic layers 305, 307 in FIG. 3 having soft magnetic properties) is oriented in the same direction as the magnetization of the magnetic pinned layer (the other one of the first and second magnetic layers 305, 307 in FIG. 3 having hard magnetic characteristics), the resistance of the memory cell (301 in FIG. 3) will be low due to spin dependent scattering of minority electrons only. However, when the magnetization of the magnetic free layer and the magnetic pinned layer are anti-parallel to each other (that is, with regard to FIG. 3, the magnetizations of the first and second magnetic layers 305 and 307 are anti-parallel to each other), both the minority and majority electrons will be scattered, resulting in a larger resistance state.

A writing operation may comprise applying a current through the bit line (303 in FIG. 3) to the memory cell (while the MOSFET device 302 in FIG. 3 is a connecting state). When the current flows through the MTJ structure (in FIG. 3 comprising the first, second magnetic layers 305, 307 and the dielectric layer 306), upon a sufficient high current above the switching threshold of the magnetic free layer, the magnetization of the magnetic free layer may be reversed due to STT. As one example, assume that the MTJ device is configured such that the first magnetic layer 305 is the magnetic pinned layer and the second magnetic layer 307 is the magnetic free layer. In that illustrative example, the current may be supplied to the MTJ in that the current is first supplied to the magnetic pinned layer 305 having the magnetization fixed at a first direction aligning the spin of the electrons in the current along the first direction. This polarized current having electrons with spin in the first direction may then be supplied to the magnetic free layer 307 aligning the magnetization of the magnetic free layer 307 with the magnetization direction of the magnetic pinned layer 305 along the first direction.

After a complete reading of the present application, a person skilled in the art will appreciate that memory cells in accordance with various aspects of the present disclosure may provide a small footprint area as opposed to conventional MRAM cells having in-plane magnetization.

The person skilled in the art will appreciate that, although STT structures are described below, this does not pose any limitation to the present disclosure and a classic design may be chosen instead.

After a complete reading of the present application, a person skilled in the art will appreciate that, although MTJ's with magnetic materials having soft and hard magnetic properties are described as first and second magnetic materials, this does not pose any limitation on the present disclosure. For example, an anti-ferromagnetic layer may be provided in contact with one of the first and second magnetic layers which are then provided as soft-magnetic layers and the anti-ferromagnetic layer pinning raising the magnetic coercivity of the coupled soft-magnetic layer resulting in a hard-magnetic behavior for the coupled layer, the other layer (not coupled to the anti-ferromagnetic layer) implementing a magnetic free layer. This effect occurs due to exchange bias in bilayers (or multilayers) of magnetic materials where the hard magnetization behavior of an anti-ferromagnetic thin film causes a shift in the soft magnetization curve of a ferromagnetic film.

After a complete reading of the present application, a person skilled in the art will appreciate that process flows for fabricating MRAM cells in accordance with some illustrative embodiments of the present disclosure may combine process elements known from MRAM processes with process elements known from FINFET processing. For example, after a BEOL ILD layer may be provided in some illustrative embodiments, trenches/vias may be etched through the ILD layer (alternatively, an active semiconductor layer of an SOI substrate) and the underlying BLoK layer (alternatively, BOX layer of SOI substrates) may be opened. BLoK refers in this context to a buried low-k layer. Then, a dielectric layer ("tunnel barrier layer") may be deposited by means of an anisotropic deposition process, such as atomic layer deposition (ALD). Alternatively, this process may be skipped and combined with a later process when depositing a first magnetic material. After removing the dielectric layer ("tunnel barrier layer") from horizontal areas of the ILD layer due to an applied anisotropic etch process, a first magnetic layer of the MRAM cell under fabrication may be deposited (possibly with an anisotropic deposition process like ALD), followed by an anisotropic etch process in which the first magnetic layer may be removed on all horizontal areas of the wafer. Next, the ILD layer may be removed in the MRAM area (e.g., by an etch process comprising HF), leaving the first magnetic layer and the tunnel barrier as vertical stacks. Subsequently, a second magnetic material may be deposited and, after removing the second magnetic material from horizontal areas, the vertical stacks corresponding to the second vertical stacks of FIG. 1i may be formed. After filling spaces between the vertical stacks with an electrode material, e.g., copper, MRAM electrodes may be formed in a planarization process and the structure as illustrated in FIG. 1k may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a memory device structure, the method comprising:
    providing a dielectric layer formed over a wafer substrate;
    forming at least two trenches in said dielectric layer, said at least two trenches completely passing through said dielectric layer along a first direction which is substantially perpendicular to an upper surface of said wafer substrate;
    forming a nonmagnetic layer on sidewalls of said at least two trenches;
    forming a first magnetic layer on said nonmagnetic layer positioned on said sidewalls;
    selectively removing said dielectric layer relative to said nonmagnetic layer and said first magnetic layer, wherein at least four first vertical stacks are formed upon removing said dielectric layer, each stack being formed from said nonmagnetic layer and said first magnetic layer which are stacked along a second direction perpendicular to said first direction;
    forming a second magnetic layer on sidewalls of said first vertical stacks so as to form respective second vertical stacks from said first vertical stacks and said second magnetic layer, each respective second vertical stack comprising said nonmagnetic layer interposed between said first magnetic layer and said second magnetic layer; and
    forming a first electrical contact that is electrically coupled to said first magnetic layer and a second electrical contact that is electrically coupled to said second magnetic layer.

2. The method of claim 1, wherein forming said nonmagnetic layer comprises conformally depositing a nonmagnetic material over said dielectric layer and within said trenches, and subsequently performing an anisotropic etching process, said anisotropic etching process removing said nonmagnetic material from any surface parallel to said upper surface of said wafer substrate.

3. The method of claim 1, wherein forming said first magnetic layer comprises conformally depositing a first magnetic material over said dielectric layer and on said nonmagnetic layer within said trenches, and subsequently performing an anisotropic etching process, said anisotropic etching process removing said first magnetic material from any surface parallel to said upper surface of said wafer substrate.

4. The method of claim 1, wherein forming said second magnetic layer comprises conformally depositing a second magnetic material on said first vertical stack, and subsequently performing an anisotropic etching process, said anisotropic etching process removing said second magnetic material from any surface parallel to said upper surface of said wafer substrate.

5. The method of claim 1, wherein said first and second magnetic layers are formed from ferromagnetic materials having different magnetic coercivities.

6. The method of claim 1, wherein said second magnetic layer is coupled with an anti-ferromagnetic material inducing an exchange bias in said second magnetic layer.

7. The method of claim 1, wherein a thickness of said first magnetic layer is smaller than a thickness of said second magnetic layer.

8. The method of claim 7, wherein said first magnetic layer has a magnetic coercivity that is greater than that of said second magnetic layer.

9. The method of claim 1, wherein a thickness of said nonmagnetic layer is in a range from about 2-50 Angstrom.

10. The method of claim 1, further comprising:
    providing a MOSFET device having a gate electrode coupled to a word line, a source electrode and a drain electrode;
    forming said dielectric layer over said MOSFET device; and
    providing a memory cell comprising said MOSFET device and one of said second vertical stacks, wherein said memory cell is formed by:
        electrically coupling one of said first and second contacts to one of said source and drain electrode, and
        electrically coupling said other one of said first and second contacts to a bit line.

11. The method of claim 10, wherein said MOSFET device is an NMOS device and said first contact is electrically coupled to said drain electrode of said NMOS device, while said second contact is electrically coupled to said bit line.

12. A method of forming a memory device structure, the method comprising:
    providing a dielectric layer formed over a wafer substrate;
    forming at least two trenches in said dielectric layer, said at least two trenches completely passing through said dielectric layer along a first direction which is substantially perpendicular to an upper surface of said wafer substrate;
    forming a nonmagnetic layer on sidewalls of said at least two trenches;
    forming a first magnetic layer on said nonmagnetic layer positioned on said sidewalls;
    selectively removing said dielectric layer relative to said nonmagnetic layer and said first magnetic layer, wherein at least four first vertical stacks are formed upon removing said dielectric layer, each of said first vertical stacks being formed from said nonmagnetic layer and said first magnetic layer which are stacked along a second direction perpendicular to said first direction;
    forming a second magnetic layer on sidewalls of said first vertical stacks so as to form respective second vertical stacks from said first vertical stacks and said second magnetic layer, a thickness of said first magnetic layer being smaller than a thickness of said second magnetic layer, each of said second vertical stacks comprising said nonmagnetic layer interposed between said first magnetic layer and said second magnetic layer and wherein at least one of a magnetic coercivity, a rest magnetization and a saturation magnetization of said second magnetic layer is less than, respectively, a magnetic coercivity, a rest magnetization and a saturation magnetization of said first magnetic layer; and forming a first electrical contact that is electrically coupled to said first magnetic layer and a second electrical contact that is electrically coupled to said second magnetic layer.

13. The method of claim 12, wherein forming said nonmagnetic layer comprises conformally depositing a nonmagnetic material over said dielectric layer and within said trenches, and subsequently performing an anisotropic etching process, said anisotropic etching process removing said nonmagnetic material from any surface parallel to said upper surface of said wafer substrate.

14. The method of claim 13, wherein forming said first magnetic layer comprises conformally depositing a first magnetic material over said dielectric layer and on said nonmagnetic layer within said trenches, and subsequently performing an anisotropic etching process, said anisotropic etching process removing said first magnetic material from any surface parallel to said upper surface of said wafer substrate.

15. The method of claim 14, wherein forming said second magnetic layer comprises conformally depositing a second magnetic material on said first vertical stack, and subsequently performing an anisotropic etching process, said anisotropic etching process removing said second magnetic material from any surface parallel to said upper surface of said wafer substrate.

16. The method of claim 12, wherein said second magnetic layer is coupled with an anti-ferromagnetic material inducing an exchange bias in said second magnetic layer.

17. The method of claim 12, further comprising:
providing a MOSFET device having a gate electrode coupled to a word line, a source electrode and a drain electrode;
forming said dielectric layer over said MOSFET device; and
providing a memory cell comprising said MOSFET device and one of said second vertical stacks, wherein said memory cell is formed by:
electrically coupling one of said first and second contacts to one of said source and drain electrode, and
electrically coupling said other one of said first and second contacts to a bit line.

18. The method of claim 17, wherein said MOSFET device is an NMOS device and said first contact is electrically coupled to said drain electrode of said NMOS device, while said second contact is electrically coupled to said bit line.

\* \* \* \* \*